(12) United States Patent
Sung et al.

(10) Patent No.: US 12,706,274 B2
(45) Date of Patent: Aug. 11, 2026

(54) PLASMA ETCHING APPARATUS AND SEMICONDUCTOR PROCESSING SYSTEM

(71) Applicant: SAMSUNG ELECTRONICS CO., LTD., Suwon-si (KR)

(72) Inventors: Dougyong Sung, Seoul (KR); Youngdo Kim, Hwaseong-si (KR); Byeongsang Kim, Hwaseong-si (KR); Yunhwan Kim, Hwaseong-si (KR); Jungmo Yang, Pyeongtaek-si (KR); Sejin Oh, Hwaseong-si (KR); Sungho Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1185 days.

(21) Appl. No.: 17/695,062

(22) Filed: Mar. 15, 2022

(65) Prior Publication Data

US 2023/0078095 A1 Mar. 16, 2023

(30) Foreign Application Priority Data

Sep. 14, 2021 (KR) ........................ 10-2021-0122491

(51) Int. Cl.
*H01J 37/32* (2006.01)
*H10P 72/00* (2026.01)

(52) U.S. Cl.
CPC .. *H01J 37/32082* (2013.01); *H01J 37/32568* (2013.01); *H01J 37/32577* (2013.01);
(Continued)

(58) Field of Classification Search
None
See application file for complete search history.

(56) References Cited

U.S. PATENT DOCUMENTS 5,314,603 A * 5/1994 Sugiyama ......... H01J 37/32935 156/345.47
5,824,606 A 10/1998 Dible et al.
(Continued)

FOREIGN PATENT DOCUMENTS

GB 2 321 765 A 8/1998
JP 10-214822 A 8/1998
(Continued)

OTHER PUBLICATIONS

JP-06053176-A, Masumoto, Dry Etcher, Feb. 25, 1994, abstract (Year: 1994).*

(Continued)

*Primary Examiner* — Sylvia MacArthur
*Assistant Examiner* — Michelle Crowell
(74) *Attorney, Agent, or Firm* — Sughrue Mion, PLLC

(57) ABSTRACT

A plasma etching apparatus includes a housing having a processing space; a support inside the housing, the support configured to support a substrate and including at least one lower electrode; at least one upper electrode facing the at least one lower electrode; a sidewall electrode disposed on a sidewall of the housing; a lower radiofrequency (RF) power source connected to the at least one lower electrode and configured to apply RF power; an upper RF power source connected to the at least one upper electrode and configured to apply RF power; a lower insulator adjacent to the at least one lower electrode; an upper insulator adjacent to the at least one upper electrode; at least one lower detector embedded in the lower insulator; and at least one upper detector embedded in the upper insulator.

20 Claims, 16 Drawing Sheets

(52) U.S. Cl.
CPC ................ *H01J 2237/06375* (2013.01); *H01J 2237/2007* (2013.01); *H01J 2237/334* (2013.01)

(56) References Cited

U.S. PATENT DOCUMENTS 6,849,154 B2 2/2005 Nagahata et al.
6,902,646 B2* 6/2005 Mahoney .......... H01J 37/32935 118/712
7,892,444 B2 2/2011 Nishio
8,262,847 B2 9/2012 Dhindsa et al.
8,368,308 B2 2/2013 Banna et al.
9,161,428 B2 10/2015 Colllins et al.
9,852,889 B1 12/2017 Kellogg et al.
2004/0061448 A1 4/2004 Avoyan et al.
2004/0149221 A1* 8/2004 Koshimizu ....... H01J 37/32082 156/345.43
2005/0067386 A1* 3/2005 Mitrovic ........... H01J 37/32174 219/121.43
2007/0227657 A1* 10/2007 Yamazawa ........ H01J 37/32082 156/345.24
2007/0227667 A1* 10/2007 Yamazawa ........ H01L 21/67069 156/345.48
2013/0134877 A1* 5/2013 Kim ......................... H05H 1/46 315/111.21
2013/0284369 A1 10/2013 Kobayashi et al.
2014/0214351 A1 7/2014 Valcore, Jr. et al.
2014/0265910 A1* 9/2014 Kobayashi ........ H01J 37/32183 315/246
2016/0126069 A1* 5/2016 Kwon .................... H05B 31/26 315/111.21
2021/0217589 A1* 7/2021 Savas ................ H01J 37/32146

FOREIGN PATENT DOCUMENTS

KR 10-2016-0017706 A 2/2016
KR 10-2189873 B1 12/2020

OTHER PUBLICATIONS

Sung, et al., "Effect on plasma and etch-rate uniformity of controlled phase shift between rf voltages applied to powered electrodes in a triode capacitively coupled plasma reactor," Journal of Vacuum Science & Technology, A 27, 13, 2009, Total 8 pages.

* cited by examiner

PLASMA ETCHING APPARATUS AND SEMICONDUCTOR PROCESSING SYSTEM

CROSS TO REFERENCE TO THE RELATED APPLICATION

This application claims benefit of priority to Korean Patent Application No. 10-2021-0122491 filed on Sep. 14, 2021 in the Korean Intellectual Property Office, the disclosure of which is incorporated herein by reference in its entirety.

BACKGROUND

Embodiments of the present disclosure relate to a plasma etching apparatus and a semiconductor processing system.

An etching process is a process of removing a thin film from a region excluding a region thereof in which photoresist is formed by photolithography. Recently, plasma is used in a substrate etching process among semiconductor processes. Plasma etching may be performed by applying high energy to gaseous molecules in a vacuum state to ionize or decompose molecules for activation thereof, and allowing activated particles to collide with the thin film to break a crystal structure of the thin film to remove the thin film.

During the plasma etching, an operating frequency of capacitively coupled plasma (CCP) is considered to be a very high frequency (VHF) such as 60 MHz to 100 MHz. Application of a high frequency to a large-area chamber brings about a skin effect in which current flows to the outside of a conductor as the frequency increases, thereby causing a problem of non-uniformity in surface plasma.

SUMMARY

An aspect of the present disclosure is to provide a plasma etching apparatus capable of more accurately controlling plasma uniformity by directly measuring a parameter of RF power from an embedded detection member.

According to one or more embodiments, a plasma etching apparatus is provided. The plasma etching apparatus includes a housing having a processing space; a support inside the housing, the support configured to support a substrate and including at least one lower electrode; at least one upper electrode facing the at least one lower electrode; a sidewall electrode disposed on a sidewall of the housing; a lower radiofrequency (RF) power source connected to the at least one lower electrode and configured to apply RF power; an upper RF power source connected to the at least one upper electrode and configured to apply RF power; a lower insulator adjacent to the at least one lower electrode; an upper insulator adjacent to the at least one upper electrode; at least one lower detector embedded in the lower insulator; and at least one upper detector embedded in the upper insulator.

According to one or more embodiments, a plasma etching apparatus is provided. The plasma etching apparatus includes a housing having a processing space; an electrostatic chuck inside the housing, the electrostatic chuck configured to support a substrate and including at least one lower electrode; at least one upper electrode facing the at least one lower electrode; a lower radiofrequency (RF) power source connected to the at least one lower electrode and configured to apply lower RF power of a first frequency; an upper RF power source connected to the at least one upper electrode and configured to supply upper RF power of the first frequency; a lower insulator disposed adjacently to the at least one lower electrode, and the lower insulator embedded with at least one lower detector; an upper insulator disposed adjacent to the at least one upper electrode, and the upper insulator embedded with at least one upper detector; and a controller configured to perform closed loop phase shift control on at least one from among the upper RF power source and the lower RF power source by performing a calculation that includes a lower parameter measurement value obtained by the at least one lower detector and an upper parameter measurement value obtained by the at least one upper detector, wherein a total number of the at least one lower electrode is equal to a total number of the at least one lower detector, and a total number of the at least one upper electrode is equal to a total number of the at least one upper detector.

According to one or more embodiments, a semiconductor processing system is provided. The semiconductor processing system includes a plurality of semiconductor processing chambers, each of the plurality of semiconductor processing chambers including: a housing, an upper radiofrequency (RF) power source configured to supply an upper RF power to an upper electrode inside the housing, a lower RF power source configured to supply lower RF power to a lower electrode facing the upper electrode, an upper detector configured to detect a parameter related to the upper RF power, and a lower detector configured to detect a parameter related to the lower RF power. The semiconductor processing system further includes a plurality of synchronization signal processing circuits configured to synchronize data detected by the upper detector and the lower detector of each of the plurality of semiconductor processing chambers; and a data server storing raw data received from the plurality of synchronization signal processing circuits, and configured to optimize a parameter for controlling the plurality of semiconductor processing chambers based on the raw data.

BRIEF DESCRIPTION OF DRAWINGS

The above and other aspects, features, and advantages of embodiments of the present disclosure will be more clearly understood from the following detailed description, taken in conjunction with the accompanying drawings, in which.

DETAILED DESCRIPTION

Hereinafter, non-limiting example embodiments of the present disclosure will be described with reference to the accompanying drawings. However, the present disclosure is not limited to the embodiments described below, and may be embodied in various forms and various modifications may be made. The description of the present embodiments is provided so that the present disclosure is complete, and to fully inform those skilled in the art to which the present disclosure pertains on the scope of the present disclosure. In the accompanying drawings, components may be exaggerated or reduced for convenience of description.

When an element is described as being "on" or "adjacent to" another element, it may directly abut on or be connected to the other element, but another element may exist in between. It should be understood that, when it is described that a certain element is "directly on" or "directly" of another element, it may be understood that another element does not exist in between. Other expressions describing a relationship between elements, for example, "between" and "directly between", etc. may be interpreted similarly.

A singular expression includes a plural expression unless the context clearly states otherwise. Terms such as "comprises", "includes", or "have" are intended to designate that a feature, number, step, action, component, part, or combination thereof described in the specification exists, and it may be interpreted that one or more other features or numbers, steps, operations, components, parts, or combinations thereof may be added.

Unless otherwise defined, terms used in the present disclosure may be interpreted as having meanings commonly known to those of ordinary skill in the art.

Figure 1:
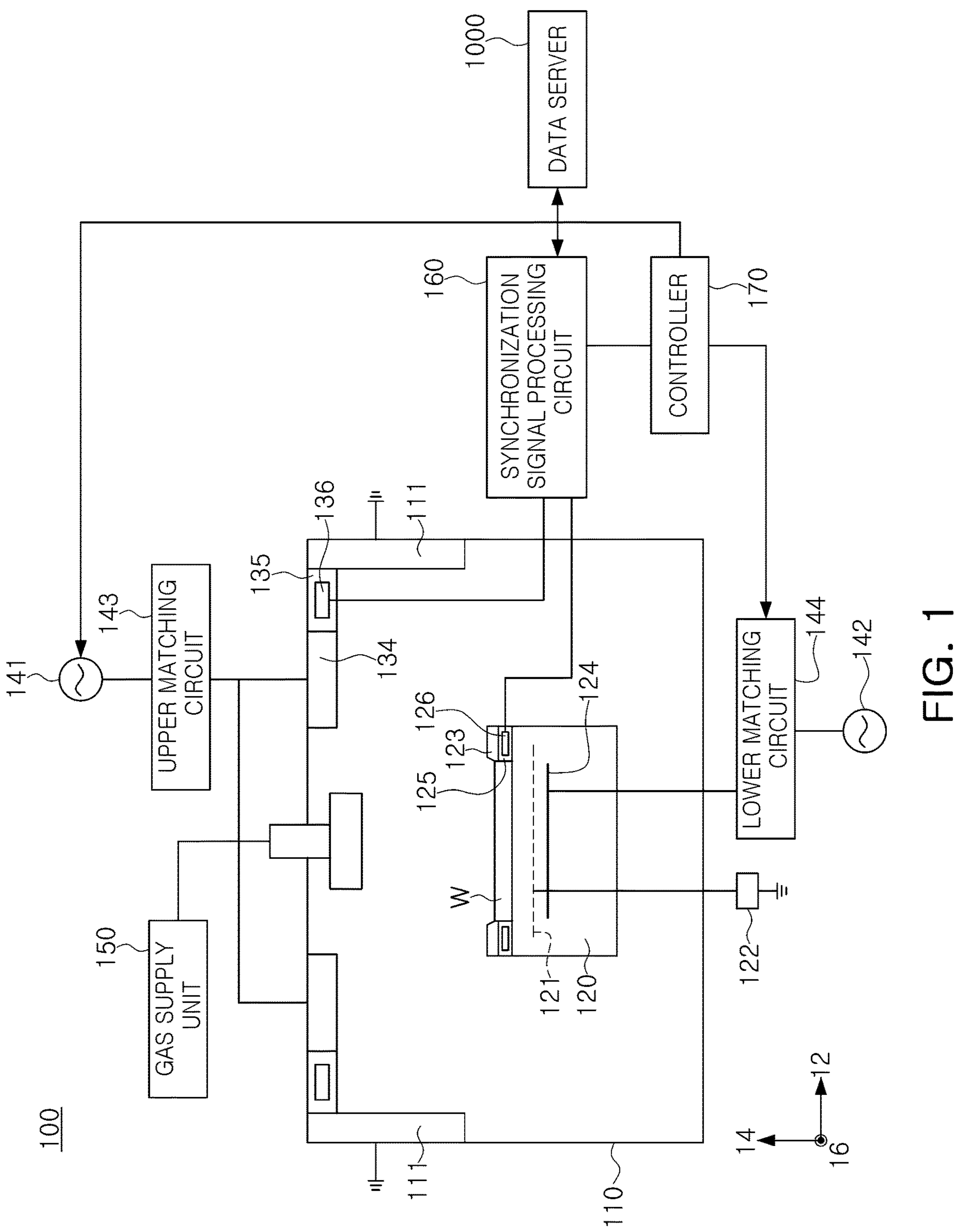
FIG. 1 is a diagram schematically illustrating a plasma etching apparatus according to an embodiment of the present disclosure.

FIG. 1 is a diagram schematically illustrating a plasma etching apparatus according to an embodiment of the present disclosure.

With reference to FIG. 1, directions 12 and 16 may be horizontal directions, and direction 14 may be a vertical direction.

First, referring to FIG. 1, a plasma etching apparatus 100 according to an embodiment of the present disclosure may be equipment for performing a semiconductor process using plasma. The plasma etching apparatus 100 according to an embodiment of the present disclosure may be provided as a semiconductor processing chamber. A semiconductor processing chamber according to an example may include a housing 110, a support unit 120, a lower electrode 124 formed inside the support unit 120, an upper electrode 134, a sidewall electrode 111, an upper insulating member 135 (e.g., an insulator), a lower insulating member 125 (e.g., an insulator), an upper detection member 136 (e.g., a detector), a lower detection member 126 (e.g., a detector), an upper RF power source 141, a lower RF power source 142, an upper matching circuit 143, a lower matching circuit 144, a gas supply unit 150, a synchronization signal processing circuit 160, and a controller 170.

The housing 110 may provide a processing space in which a plasma processing process is performed. The housing 110 may have a processing space therein and may be provided in a sealed shape.

According to an example, the support unit 120 may be provided as an electrostatic chuck (ESC). A substrate W, which is a target of a semiconductor process, may be seated on an upper portion of the support unit 120, and, for example, a ceramic coating layer may be formed on an upper region of the support unit 120 in direct contact with the substrate W. The ceramic coating layer may be formed of aluminum oxide ($Al_2O_3$), aluminum nitride (AlN), silicon carbide (SiC), or the like, and may have a thickness of about 1 mm. However, a material and thickness of the ceramic coating layer may be variously modified according to embodiments. For example, the substrate W may be a semiconductor substrate on which the semiconductor process is performed, or a wafer formed of a semiconductor material such as silicon. Semiconductor devices, wiring patterns connected to the semiconductor devices, and insulating layers covering the semiconductor devices and the wiring patterns may be formed on the substrate W by semiconductor processes, and a plurality of semiconductor chips may be produced from the substrate W. Hereinafter, it is assumed that the support unit 120 is provided as an electrostatic chuck.

In an embodiment, the substrate W may be fixed in a state of being seated on the electrostatic chuck by a voltage supplied by a chuck voltage supply unit 122 to an electrostatic chuck through an electrode 121 (e.g., an electrostatic chuck electrode). For example, the chuck voltage supply unit 122 may supply a constant voltage to the electrostatic chuck, and the constant voltage may have a magnitude of several hundred to several thousand volts. The chuck voltage supply unit 122 may be connected to the electrode 121 inside the electrostatic chuck to supply a constant voltage, and the electrode 121 inside the electrostatic chuck may be formed to face a substantial front surface of the substrate W.

In order to perform the semiconductor process, a reaction gas may be introduced into the housing 110 through the gas supply unit 150. The lower RF power source 142 supplies RF power to the lower electrode 124 formed inside the support unit 120, and the upper RF power source 141 may supply RF power to the upper electrode 134 positioned above the substrate W and the support unit 120. Each of the lower RF power source 142 and the upper RF power source 141 may be a high frequency power source for supplying bias power.

Plasma including radicals and ions of a reactive gas may be generated by the upper RF power source 141 and the lower RF power source 142, and the reactive gas may be activated by the plasma to increase reactivity. For example, when the semiconductor processing equipment is etching equipment, radicals and ions of a reactive gas may be concentrated on the substrate W by the RF power supplied from the upper RF power source 141 to the upper electrode 134. At least some of layers or semiconductor substrates included in the substrate W may be dry etched by radicals and ions of the reactive gas. The upper matching circuit 143 for impedance matching may be provided between the upper RF power source 141 and the upper electrode 134. The lower matching circuit 144 for impedance matching may be provided between the lower RF power source 142 and the lower electrode 124.

The plasma etching apparatus 100 may excite a process gas supplied from the gas supply unit 150 into a plasma state. The plasma etching apparatus 100 may use a capacitively coupled plasma (CCP) type plasma source. When a capacitively coupled plasma type plasma source is used, the upper electrode 134 and the lower electrode 124 may be included in a chamber.

The upper electrode 134 and the lower electrode 124 may be disposed parallel to each other vertically inside the chamber. The upper RF power source 141 and the lower RF power source 142 may be connected to the upper electrode 134 and the lower electrode 124, respectively. An electromagnetic field is formed in a space between the electrodes, and a process gas supplied to the space may be excited into a plasma state. A substrate processing process may be performed using the plasma. According to an example, the upper electrode 134 may serve as a shower head, and the lower electrode 124 may serve as a body. According to an example, the upper electrode 134 may be provided in a ring shape, and the lower electrode 124 may be provided in a disk shape. The shapes of the upper electrode 134 and the lower electrode 124 described in the present disclosure are only examples, and the shapes of the upper electrode 134 and the lower electrode 124 are not limited thereto.

According to an example, the plasma etching apparatus 100 illustrated in FIG. 1 may be provided as a triode capacitively coupled plasma (triode CCP). According to an example, the plasma etching apparatus 100 illustrated in FIG. 1 may be provided as a structure in which upper RF power source 141 and the lower RF power source 142 are provided to the upper electrode 134 and the lower electrode 124, respectively, and a ground is connected to the sidewall electrode 111. According to an example, the upper electrode 134 may be surrounded by a symmetrical RF ground electrode. The upper insulating member 135 may separate the upper electrode 134 from the sidewall electrode 111. The sidewall electrode 111 may be connected to the ground. In this case, the frequencies of the upper RF power source 141 and the lower RF power source 142 connected to the upper electrode 134 and the lower electrode 124, respectively, may be the same. According to an example, the upper RF power source 141 and the lower RF power source 142 may apply RF power of a first frequency to the upper electrode 134 and the lower electrode 124, respectively. According to an example, a first frequency may be a frequency between 60 MHz and 100 MHz. According to an example, RF power applied from the upper RF power source 141 and RF power applied from the lower RF power source 142 may have the same frequency and different powers.

According to an example, the plasma etching apparatus 100 may include the upper insulating member 135 and the lower insulating member 125. The upper insulating member 135 may be provided in a shape surrounding the upper electrode 134. The lower insulating member 125 may be provided in a shape surrounding the lower electrode 124. The upper insulating member 135 may be disposed between the upper electrode 134 and the sidewall electrode 111 to insulate the upper electrode 134 from the sidewall electrode 111. The lower insulating member 125 may be provided to surround the electrostatic chuck including the lower electrode 124. According to an example, the lower insulating member 125 may be an edge ring disposed below a focus ring 123. According to an example, the lower insulating member 125 may be provided in the form of a ring surrounding the substrate W. The upper insulating member 135 and the lower insulating member 125 may be provided as insulators. According to an example, the upper insulating member 135 and the lower insulating member 125 may be provided in a ring shape.

According to an example, the upper insulating member 135 may include the upper detection member 136, and the lower insulating member 125 may include the lower detection member 126. The upper detection member 136 may be provided to be embedded in the upper insulating member 135. The lower detection member 126 may be provided to be embedded in the lower insulating member 125. The upper detection member 136 may detect a voltage and current of the upper electrode 134. The lower detection member 126 may detect a voltage and current of the lower electrode 124. According to an example, the lower detection member 126 may detect an average value of the voltage and current of the lower electrode 124, and the upper detection member 136 may detect an average value of the voltage and current of the upper electrode 134.

Hereinafter, an expression called a detection member is used to describe a characteristic commonly applied to the lower detection member 126 and the upper detection member 136. Hereinafter, an expression called an insulating member is used to describe a characteristic commonly applied to the lower insulating member 125 and the upper insulating member 135.

According to an example, the detection member may be a probe. According to an example, the detection member may be calibrated through a dedicated jig in the process of being embedded in the insulating member and manufactured to more accurately detect a voltage and current. The detection member may be connected to the synchronization signal processing circuit 160 to transmit data detected by the detection member to the synchronization signal processing circuit 160. The detection member and the synchronization signal processing circuit 160 may be connected by a cable.

Details of the upper detection member 136 and the lower detection member 126 will be described below along with various embodiments through FIGS. 2A and 2B to 6A and 6B.

The synchronization signal processing circuit 160 is connected to each of the lower detection member 126 and the upper detection member 136 to synchronize phases respectively measured by the lower detection member 126 and the upper detection member 136 (phase synchronization).

According to an example, the synchronization signal processing circuit 160 may synchronize data of the upper RF power source 141 with data of the lower RF power source 142. Starting points of the lower voltage measured by the lower detection member 126 and the upper voltage measured by the upper detection member 136 may be synchronized through the synchronization signal processing circuit 160. Starting points of the lower current measured by the lower detection member 126 and the upper current measured by the upper detection member 136 may be synchronized through the synchronization signal processing circuit 160.

The controller 170 may calculate a phase difference between the lower voltage and the upper voltage or a phase difference between the lower current and the upper current synchronized by the synchronization signal processing circuit 160. The controller 170 may control at least one of the upper RF power source 141 and the lower RF power source 142 so that the calculated voltage phase difference matches a target voltage phase difference or the calculated current phase difference matches a target current phase difference.

The controller 170 may apply a signal for shift-controlling the phase of voltage or current output from at least one of the upper RF power source 141 and the lower RF power source 142 to the upper RF power source 141 or the lower RF power source 142.

The controller 170 may perform closed loop phase shift control on at least one of the upper RF power source 141 and the lower RF power source 142 through calculation of a lower parameter measurement value in the lower detection member 126 and an upper parameter measurement value in the upper detection member 136. According to an example, the lower parameter measurement value may be an average value of current or voltage detected from the lower electrode 124 through the lower detection member 126, and the upper parameter measurement value may be an average value of a current or a voltage of the upper electrode 134 through the upper detection member 136. The calculation may be a calculation of a phase difference between the average value of the current detected from the upper electrode 134 and the average value of the current detected from the lower electrode 124. The calculation may be a calculation of a phase difference between the average value of the voltage detected from the upper electrode 134 and the average value of the voltage detected from the lower electrode 124.

According to an example, the controller 170 may include a calculation device and a memory. According to an example, the controller 170 may control and monitor an etching process in a plasma processing chamber through analog, digital, wired, wireless, optical, and interfaces that may be broadly described. The calculation device may be one of any type of general to purpose computer processor that may be used to control the plasma processing chamber and subprocessors. The memory may be one or more memory devices that may be easily used, such as a random access memory (RAM), a read only memory (ROM), a hard disk, a solid state drive, a flash memory, or any other form of local or remote digital storage device, coupled to the calculation device.

According to an example, the data server 1000 may be connected to the plasma etching apparatus 100. The data server 1000 may store raw data for the lower voltage, the upper voltage, and the lower current and the upper current applied from the synchronization signal processing circuit 160. When a plurality of chambers are connected to the data server 1000, the data server 1000 may separately store raw data for each of the chambers. The data server 1000 may update parameters optimized for each chamber. According to an example, the parameter updated by the data server 1000 may be phase difference information of voltage or current according to each chamber.

Figure 2A:
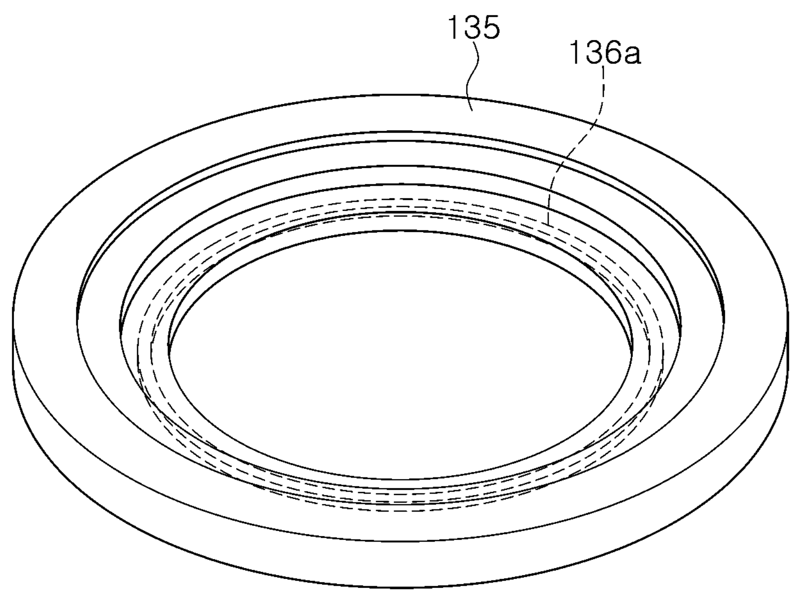
FIG. 2A is a view illustrating an upper insulating member according to example embodiments.
Figure 2B:
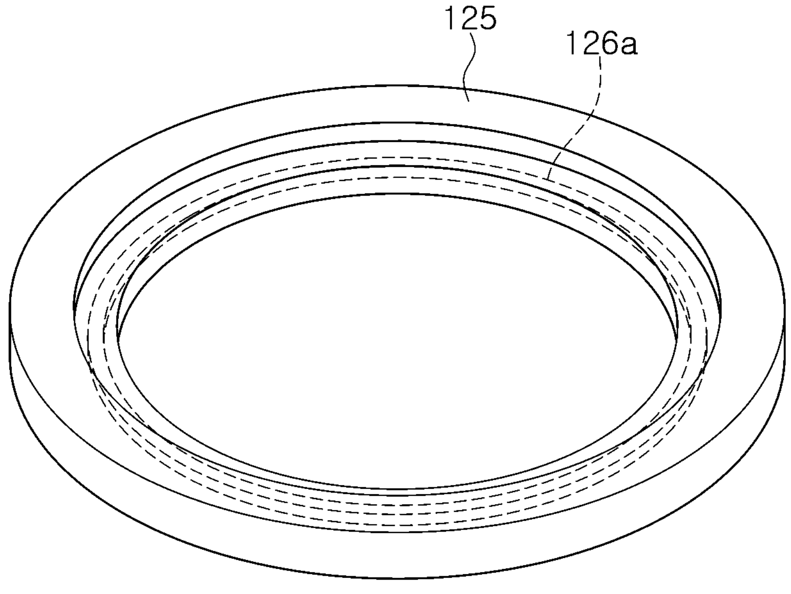
FIG. 2B is a view illustrating a lower insulating member according to example embodiments.

FIGS. 2A and 2B are views illustrating an upper insulating member and a lower insulating member according to example embodiments.

FIG. 2A shows an upper insulating member 135 according to an example embodiment, and FIG. 2B shows a lower insulating member 125 according to an example embodiment. FIGS. 2A and 2B to 6A and 6B are views illustrating the upper insulating member 135 and the lower insulating member 125 according to example embodiments. The upper detection member 136 and the lower detection member 126 are indicated by dotted lines in FIGS. 2A and 2B to 6A and 6B. The shapes of the lower insulating member 125 and the upper insulating member 135 illustrated in FIGS. 2A and 2B to 6A and 6B are merely examples and are not limited thereto.

Referring to FIGS. 2A and 2B, the upper insulating member 135 may include an upper detection member 136*a* provided to be embedded. The lower insulating member 125 may include a lower detection member 126*a* provided to be embedded. Referring to FIGS. 2A and 2B, one upper detection member 136*a* and one lower detection member 126*a* may be provided, separately. In the embodiment of FIG. 2A, the upper detection member 136*a* may detect an average value of RF parameters in the upper electrode 134. According to an example, the upper detection member 136*a* may detect an average value of the voltage and current in the upper electrode 134 and provide the detected average values as graph data for display.

According to an example, the upper detection member 136*a* may be formed through a metal print process during a manufacturing process of the upper insulating member 135. The upper detection member 136*a* may be provided to be embedded in the upper insulating member 135. According to another example, the upper detection member 136*a* may be formed in a form in which a substrate (PCB) is embedded during the manufacturing process of the upper insulating member 135. The lower detection member 126*a* may be formed in the same manner as that of the upper detection member 136*a*.

According to an example, the upper detection member 136*a* may be provided to be embedded in the upper insulating member 135, and may be provided to be spaced apart from the upper electrode 134 by a predetermined distance.

According to an example, the lower detection member 126*a* may be provided to be embedded in the lower insulating member 125, and may be provided to be spaced apart from the lower electrode 124 by a predetermined distance.

Figure 3A:
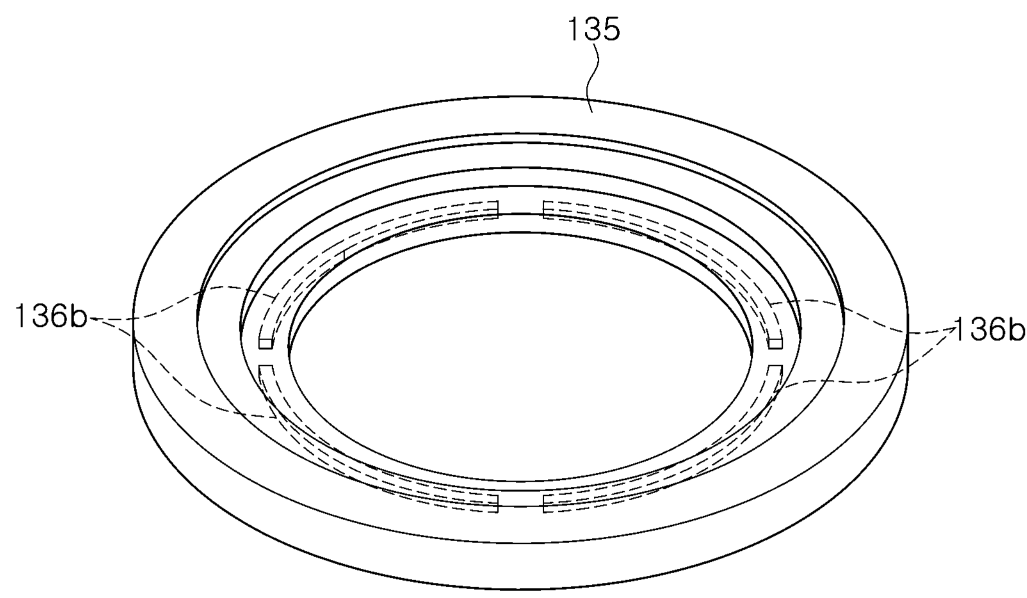
FIG. 3A is a view illustrating an upper insulating member according to an example embodiment.
Figure 3B:
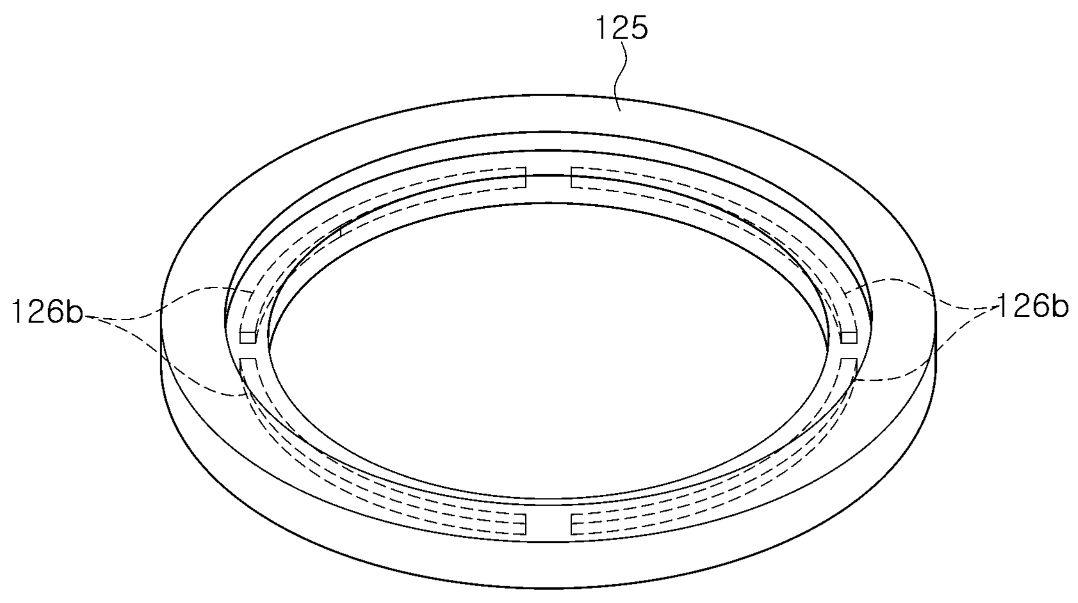
FIG. 3B is a view illustrating a lower insulating member according to an example embodiment.

FIGS. 3A and 3B are views illustrating an upper insulating member and a lower insulating member according to example embodiments.

FIG. 3A shows an upper insulating member 135 according to an example embodiment, and FIG. 3B shows a lower insulating member 125 according to an example embodiment. The same reference numerals as those of FIGS. 2A and 2B denote corresponding components, and the same descriptions as those described above will be omitted. In the embodiment of FIGS. 3A and 3B to 6A and 6B, a case having the same reference numerals as those of FIGS. 2A and 2B but different letters is to describe an embodiment different from the embodiment of FIGS. 2A and 2B and features described with the same reference numerals as described above may be the same.

Referring to FIGS. 3A and 3B, a plurality of upper detection members 136*b* and lower detection members 126*b* may be provided. According to an example, a configuration in which four upper detection members 136*b* are provided and four lower detection members 126*b* are provided is illustrated.

According to an example of FIGS. 3A and 3B, the same number of upper detection members 136*b* and the lower detection members 126*b* may be provided. According to an example of FIGS. 3A and 3B, the upper detection members 136*b* and the lower detection members 126*b* may correspond to each other, respectively. According to an example, the upper detection members 136*b* and the lower detection members 126*b* may be disposed in positions corresponding to each other in the plasma etching apparatus 100.

According to an example, the detection members may be provided to be spaced apart from each other at the same distance in a first direction in the insulating member. The first direction may be a direction extending along a circumference of the upper insulating member 135. According to an example, the detection members may be positioned on the same plane within the insulating member. According to an example, the detection members may be positioned on the same height within the insulating member. According to an example, the detection members may be disposed in positions in which there is no height difference from each other within the insulating member.

According to an example, the plurality of lower detection members 126*b* may be provided to be spaced apart from each other at the same first interval in the first direction in the lower insulating member 125. According to an example, the plurality of upper detection members 136*b* may be provided to be spaced apart from each other at the same second interval in the first direction in the upper insulating member 135.

According to an example, a first interval, an interval between the lower detection members 126*b*, and a second interval, an interval between the upper detection members 136*b*, may be equal to each other.

According to another example, the first interval, the interval between the lower detection members 126*b*, and the second interval, the interval between the upper detection members 136*b*, may be different from each other.

Figure 4A:
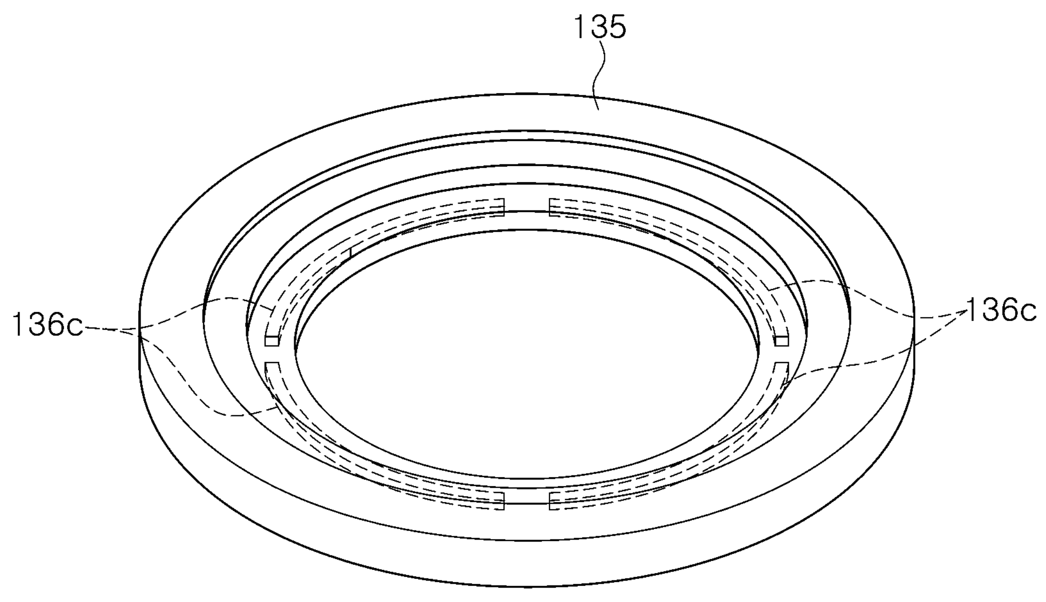
FIG. 4A is a view illustrating an upper insulating member according to an example embodiment.
Figure 4B:
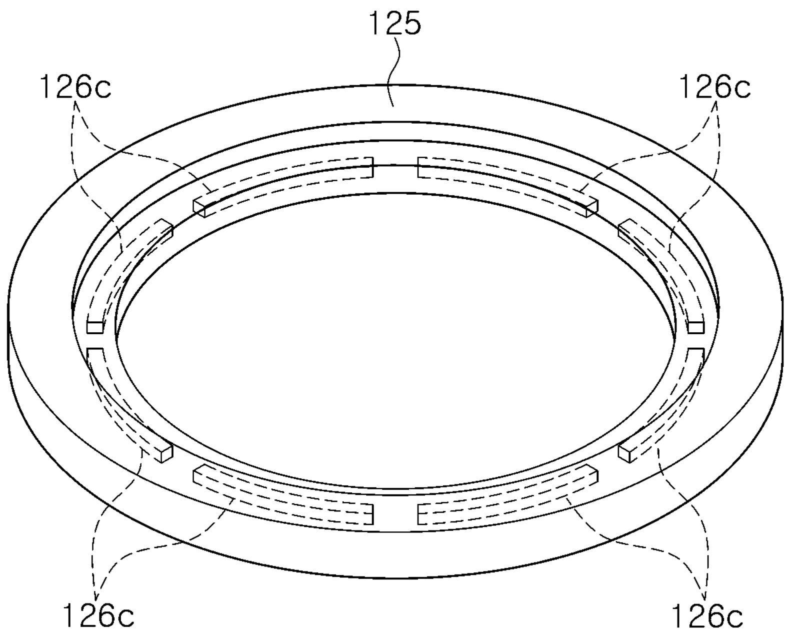
FIG. 4B is a view illustrating a lower insulating member according to an example embodiment.

FIGS. 4A and 4B are views illustrating an upper insulating member and a lower insulating member according to example embodiments.

FIG. 4A shows an upper insulating member 135 according to an example embodiment, and FIG. 4B shows a lower insulating member 125 according to an example embodiment.

Referring to FIGS. 4A and 4B, a plurality of upper detection members 136*c* and a plurality of lower detection members 126*c* may be provided. According to an example, a configuration in which four upper detection members 136*c* are provided and eight lower detection members 126*c* are provided is illustrated.

According to an example, the upper detection members 136*c* and the lower detection members 126*c* may be provided in a 1:2 correspondence. According to an example, one of the upper detection members 136*c* and two of the lower detection members 126*c* may be disposed in positions corresponding to each other in the chamber.

According to an example, the number of upper detection members 136*c* may be a multiple of the number of lower detection members 126*c*. In this case, x may be a natural number of 2 or greater.

According to another example, the number of lower detection members 126*c* may be a y multiple of the number of upper detection members 136*c*. In this case, y may be a natural number of 2 or greater.

According to an example, when the number of upper detection members 136*c* or the lower detection members 126*c* is provided in plural number, spatial resolution may be improved. In addition, when the number of upper detection members 136*c* or the lower detection members 126*c* is provided in plural number, RF parameters may be measured at various azimuth angles.

Figure 5A:
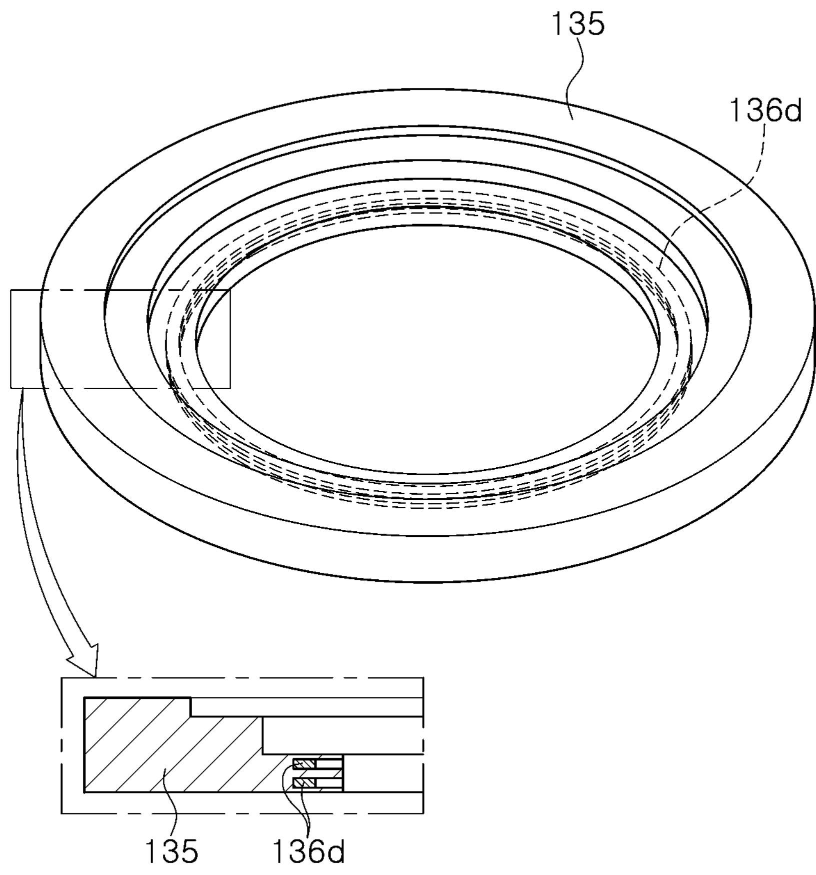
FIG. 5A is a view illustrating an upper insulating member according to an example embodiment.
Figure 5B:
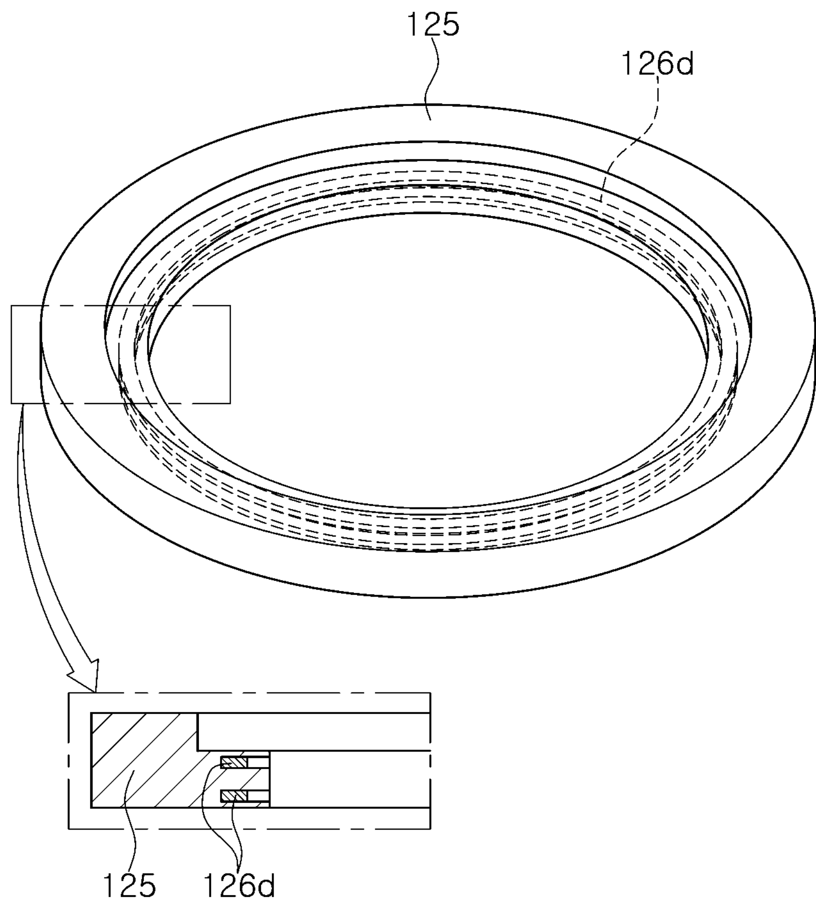
FIG. 5B is a view illustrating a lower insulating member according to an example embodiment.

FIGS. 5A and 5B are views illustrating an upper insulating member and a lower insulating member according to example embodiments.

FIG. 5A shows an upper insulating member 135 according to an example embodiment, and FIG. 5B shows a lower insulating member 125 according to an example embodiment.

According to an example, a plurality of upper detection members 136*d* or a plurality of lower detection members 126*d* may be provided and may be spaced apart from each other along a vertical axis. According to an example, two upper detection members 136*d* and two lower detection members 126*d* may be provided. According to an example, the upper detection members 136*d* and the lower detection members 126*d* may be provided to be spaced apart from each other in a second direction. The second direction may be a direction, perpendicular to the first direction. According to an example, the second direction may be a direction, perpendicular to the substrate W. According to an example, the upper detection members 136*d* and the lower detection members 126*d* may be spaced apart from each other in the second direction and are provided to be embedded in the upper insulating member 135 or the lower insulating member 125, thereby securing voltage and current data at various heights of the upper electrode 134 or the lower electrode 124.

Figure 6A:
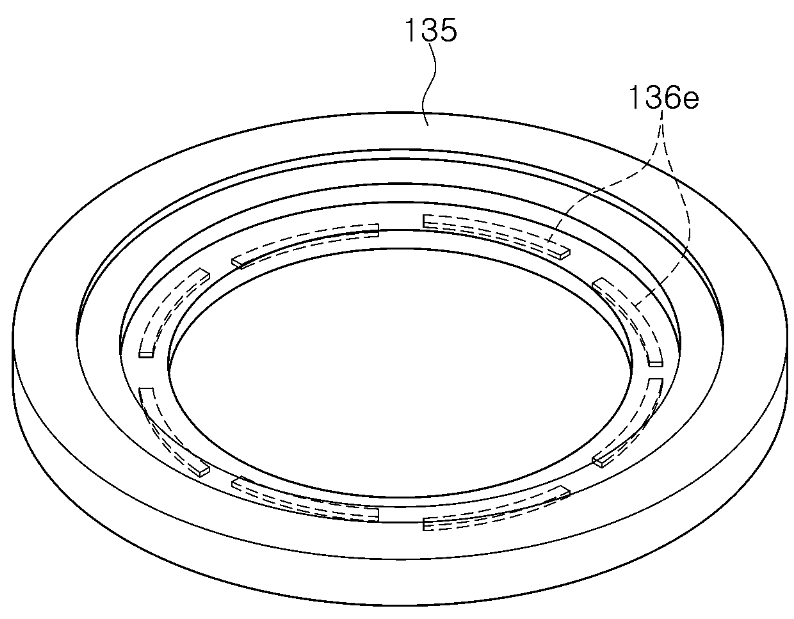
FIG. 6A is a view illustrating an upper insulating member according to an example embodiment.
Figure 6B:
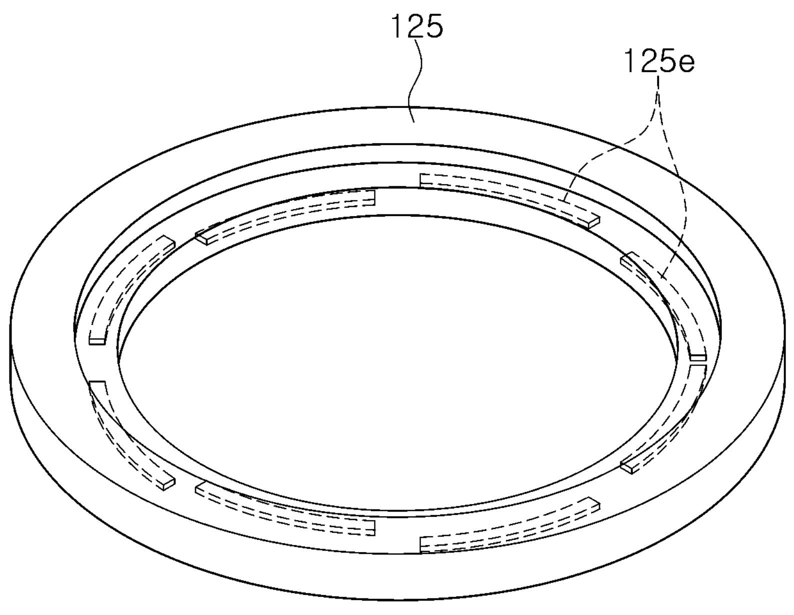
FIG. 6B is a view illustrating a lower insulating member according to an example embodiment.

FIGS. 6A and 6B are views illustrating an upper insulating member and a lower insulating member according to example embodiments.

FIG. 6A shows an upper insulating member 135 according to an example embodiment, and FIG. 6B shows a lower insulating member 125 according to an example embodiment.

According to an example, the upper detection members 136*e* and the lower detection members 126*e* may be provided to be diagonally spaced apart from each other in the second direction. According to an example, the upper detection members 136*e* and the lower detection members 126*e* may be disposed in a zigzag shape in the upper insulating member 135 or the lower insulating member 125. According to an example, eight upper detection members 136*e* and eight lower detection members 126*e* may be provided. Referring to FIGS. 6A and 6B, four detection members, among the eight detection members, may be positioned at a first height, and the remaining four detection members may be positioned at a second height. The detection member positioned at the first height and the detection member positioned at the second height may be alternately disposed with each other. According to an example, by disposing the detection member in a zigzag shape in the insulating member, interference between the plurality of detection members may be avoided.

Figure 7:
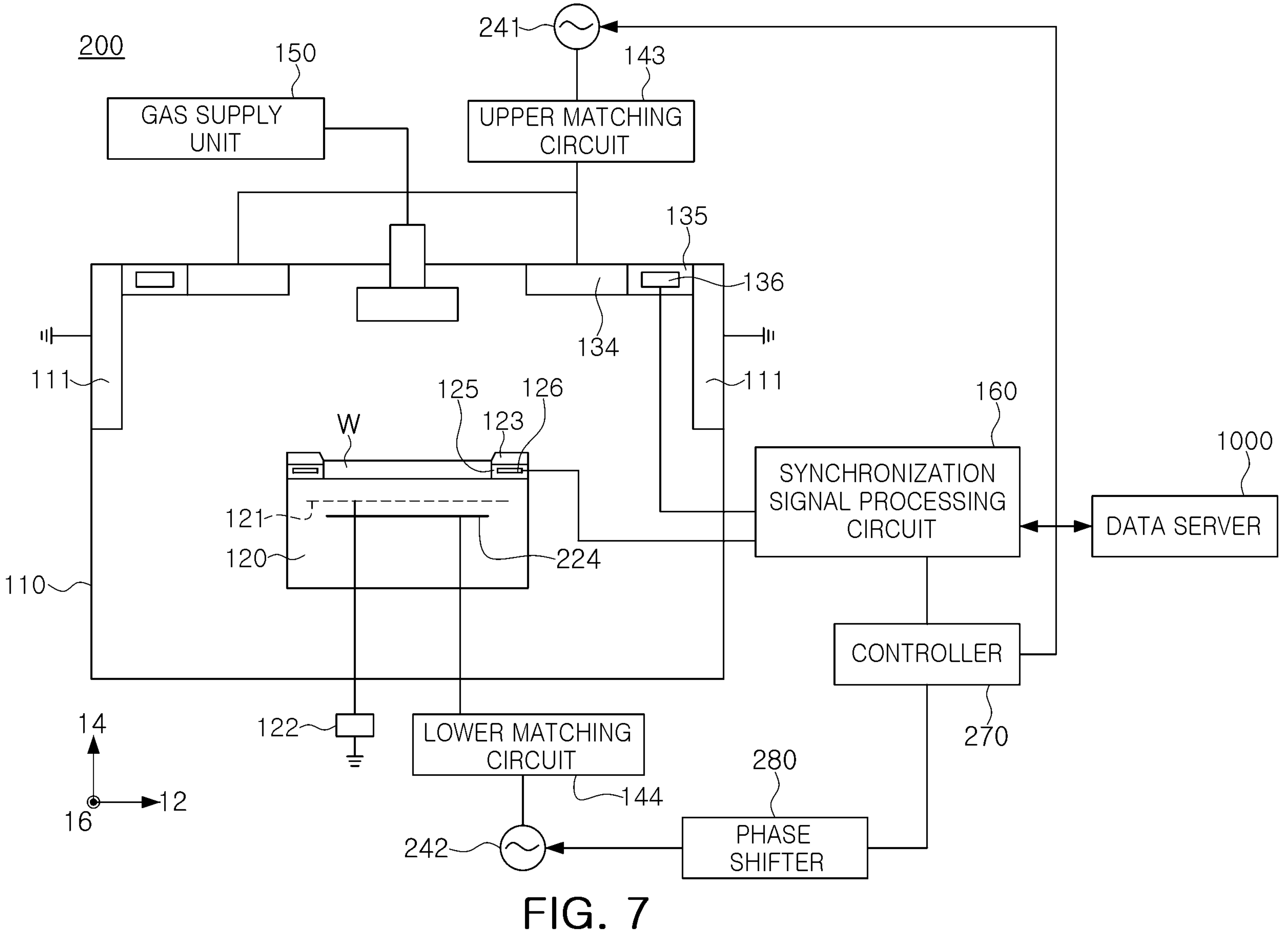
FIG. 7 is a schematic diagram illustrating a plasma etching apparatus according to an embodiment of the present disclosure.

FIG. 7 is a schematic diagram illustrating a plasma etching apparatus according to an embodiment of the present disclosure. The descriptions of the components corresponding to the components illustrated in FIG. 1 above will be omitted.

According to an example, a plasma etching apparatus 200 of FIG. 7 may further include a phase shifter 280 disposed between a lower RF power source 242 and a controller 270. In the case of the embodiment of FIG. 1, the upper RF power source 141 and the lower RF power source 142 include a phase shifter, and the upper RF power source 141 and the lower RF power source 142 may shift a phase of a voltage or a current according to a control signal applied from the controller 170. In contrast, in the case of the embodiment of FIG. 7, the separate phase shifter 280 is connected between the controller 270 and the lower RF power source 242, and thus, even when the lower RF power source 242 does not include a phase shifter, a phase of a voltage or current of the lower RF power source 242 may be controlled. According to an example of FIG. 7, the phase shifter 280 is disposed between the lower RF power source 242 and the controller 270, and the phase shifter 280 may shift a phase of the voltage or current output from the lower RF power source 242 in response to a signal applied from the controller 270.

In another embodiment, the phase shifter 280 may be disposed between the upper RF power source 241 and the controller 270, and shift a phase of a voltage or current output from the upper RF power source 241 through a signal applied from the controller 270.

In another embodiment, the phase shifter 280 may be provided to be connected between the upper RF power source 241 and the controller 270 and between the lower RF power source 242 and the controller 270.

Referring to FIG. 7, the phase shifter 280 is connected between the controller 270 and the lower RF power source 242, but referring to FIG. 8 to be described below, when a plurality of phase shifters are connected to one RF power source, the plurality of phase shifters may be provided to be connected between the upper RF power source and the upper electrode or between the lower RF power source and the lower electrode.

Figure 8:
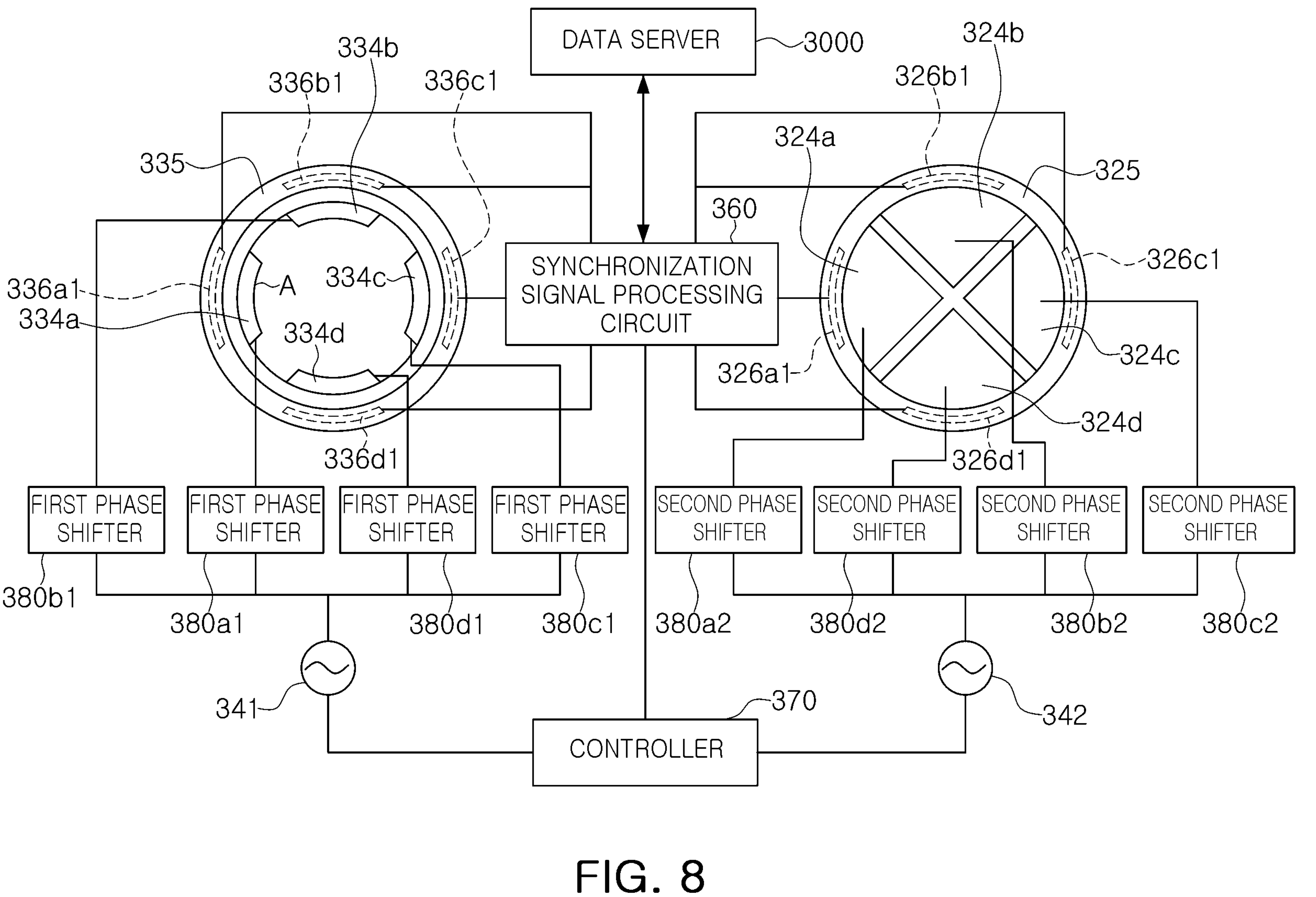
FIG. 8 is a diagram illustrating a connection relationship between an upper insulating member and a lower insulating member and an upper electrode and a lower electrode according to example embodiments.

FIG. 8 is a diagram illustrating a connection relationship between an upper insulating member and a lower insulating member and an upper electrode and a lower electrode according to example embodiments.

FIG. 8 is a view schematically illustrating a connection relationship of an upper insulating member 335, in which upper detection members **336*a*1, 336*b*1, 336*c*1, and 336*d*1 are included, and upper electrodes 334*a*, 334*b*, 334*c*, and 334*d*, and a connection relationship of a lower insulating member 325, in which lower detection members 326*a*1, 326*b*1, 326*c*1, and 326*d*1 are included, and lower electrodes 324*a*, 324*b*, 324*c*, and 324*d*. In FIG. 8**, a configuration of a matching circuit and the like are omitted.

Referring to FIG. 8, a radius of the upper insulating member 335 in which the upper detection members **336*a*1, 336*b*1, 336*c*1, and 336*d*1 are embedded may be greater than a radius of the upper electrodes 334*a*, 334*b*, 334*c*, and 334*d*. Referring to FIG. 8, a radius of the lower insulating member 325 in which the lower detection members 326*a*1, 326*b*1, 326*c*1, and 326*d*1 are embedded may be greater than a radius of the lower electrodes 324*a*, 324*b*, 324*c* and 324*d***.

FIG. 8 is a diagram illustrating a configuration of upper and lower electrodes when a plurality of upper detection members **336*a*1, 336*b*1, 336*c*1, and 336*d*1 and a plurality of lower detection members 326*a*1, 326*b*1, 326*c*1, and 326*d*1** are provided and a method of controlling a phase shift.

Referring to FIG. 8, an embodiment in which four lower detection members **326*a*1, 326*b*1, 326*c*1, and 326*d*1 are provided and four upper detection members 336*a*1, 336*b*1, 336*c*1 and 336*d*1 are provided is illustrated. According to an example, when a plurality of detection members are provided, the upper electrodes 334*a*, 334*b*, 334*c*, and 334*d* and the lower electrodes 324*a*, 324*b*, 324*c*, and 324*d* detected by the detection members correspond to the number of detection members. According to an example, if it is assumed that n lower detection members and m upper detection members are provided, n lower electrodes may be provided and m upper electrodes may be provided. In this case, n and m may be natural numbers of 2 or greater. Referring to FIG. 8, four lower detection members 326*a*1, 326*b*1, 326*c*1, 326*d*1 and four upper detection members 336*a*1, 336*b*1, 336*c*1 and 336*d*1 are provided, and four lower electrodes 324*a*, 324*b*, 324*c*, and 324*d* and four upper electrodes 334*a*, 334*b*, 334*c*, and 334*d*** may be provided to correspond thereto.

According to an example, the upper detection members **336*a*1, 336*b*1, 336*c*1, and 336*d*1 and the lower detection members 326*a*1, 326*b*1, 326*c*1, and 326*d*1 may detect voltages and currents of upper electrodes 334*a*, 334*b*, 334*c*, and 334*d* or the lower electrodes 324*a*, 324*b*, 324*c*, and 324*d* that are adjacent to positions including the respective detection members. Referring to FIG. 8, the upper detection members 336*a*1, 336*b*1, 336*c*1, and 336*d*1 and the lower detection members 326*a*1, 326*b*1, 326*c*1, and 326*d*1** may measure RF parameters of a respective electrode to which they are adjacent. As the number of electrodes is separately provided to correspond to the number of detection members, the detection members may derive average values of voltages and currents at the corresponding upper and lower electrodes.

Referring to FIG. 8, the upper electrodes **334*a*, 334*b*, 334*c*, and 334*d* may be provided as four separate electrodes, and the lower electrodes 324*a*, 324*b*, 324*c* and 324*d* may also be provided as four separate electrodes. The four separated upper electrodes 334*a*, 334*b*, 334*c*, and 334*d* may be connected to the upper RF power source 341. The first phase shifters 380*a*1, 380*b*1, 380*c*1, and 380*d*1 may be connected between each of the four separated upper electrodes 334*a*, 334*b*, 334*c*, and 334*d* and the upper RF power source 341**.

The four separated lower electrodes **324*a*, 324*b*, 324*c*, and 324*d* may be connected to the lower RF power source 342. Second phase shifters 380*a*2, 380*b*2, 380*c*2, and 380*d*2 may be connected between each of the four separated lower electrodes 324*a*, 324*b*, 324*c*, and 324*d* and the lower RF power source 342. According to an example, the upper detection members 336*a*1, 336*b*1, 336*c*1, and 336*d*1, the upper electrodes 334*a*, 334*b*, 334*c*, and 334*d*, and the first phase shifters 380*a*1, 380*b*1, 380*c*1, and 380*d*1 may be provided in the same number. According to an example, the lower detection members 326*a*1, 326*b*1, 326*c*1, and 326*d*1, the lower electrodes 324*a*, 324*b*, 324*c*, and 324*d*, and the second phase shifters 380*a*2, 380*b*2, 380*c*2, and 380*d*2** may be provided in the same number.

According to an example, when a plurality of detection members are provided, the detection members may measure voltage and current data from separate electrodes positioned adjacent thereto, respectively. The voltage and current data may be results of measuring voltage and current at the electrodes adjacent to the detection members, respectively. After the measurement results of the voltage and current in each detection member are calculated, the calculated values may be compared with a target voltage phase difference or a target current phase difference, and thereafter, in order to control only an electrode having a difference, the first phase shifters **380*a*1, 380*b*1, 380*c*1, and 380*d*1 or the second phase shifters 380*a*2, 380*b*2, 380*c*2, and 380*d*2** connected to the electrode having a difference may be controlled, thereby performing monitoring and control in the separated electrode.

According to an example, when the target voltage phase difference in the region A of FIG. 8 is different from the measured voltage phase difference, it is possible to control a closed loop shift in the separated upper electrode **334*a* by controlling only the first phase shifter 380*a*1** adjacent to the region A.

According to an embodiment of FIG. 8, the first phase shifters **380*a*1, 380*b*1, 380*c*1, 380*d*1 and the second phase shifters 380*a*2, 380*b*2, 380*c*2, 380*d*2 are connected to both of the upper RF power source 341 and the lower RF power source 342, respectively, but a phase shifter may be provided only on either one of the upper RF power source 341 or the lower RF power source 342**.

FIGS. 9A, 9B to 12 are diagrams illustrating data measurement and calculation in a detection member according to example embodiments.

Figure 9A:
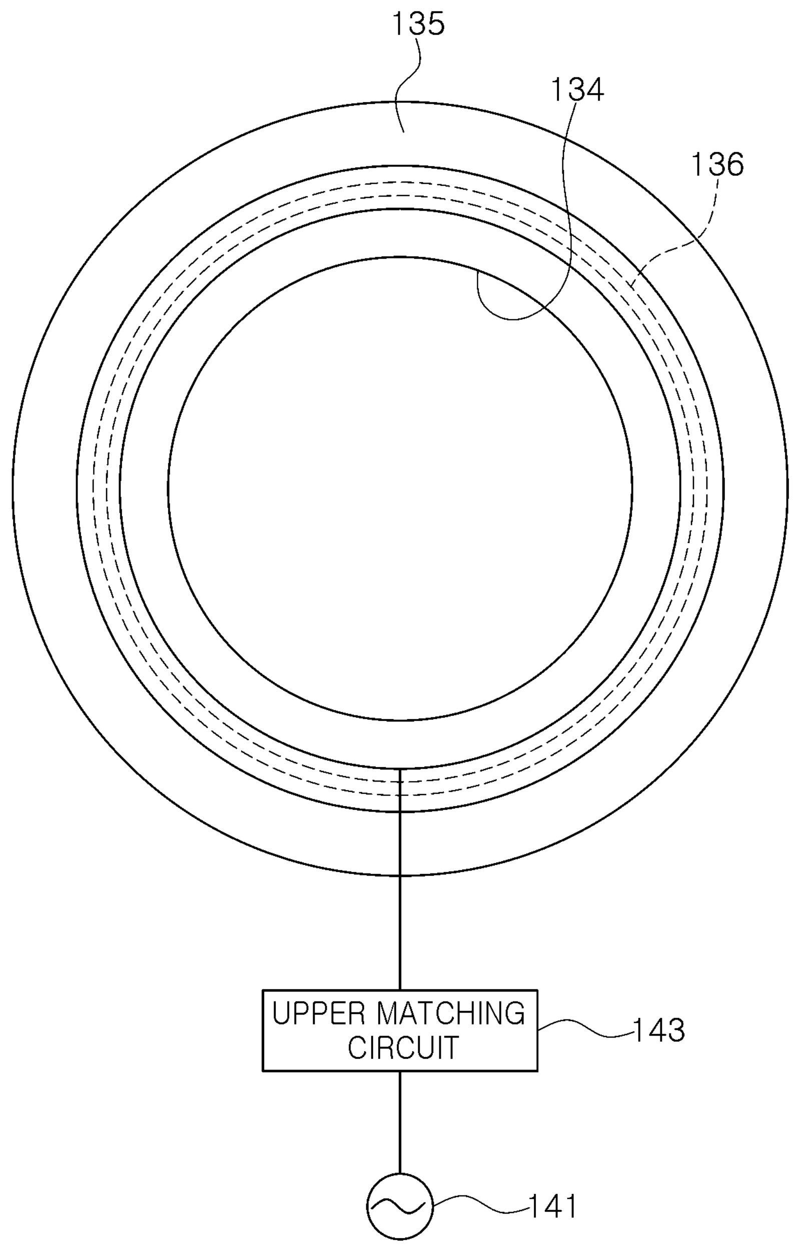
FIG. 9A is a plan view illustrating an example in which an upper detection member is embedded in an upper insulating member according to an example embodiment.
Figure 9B:
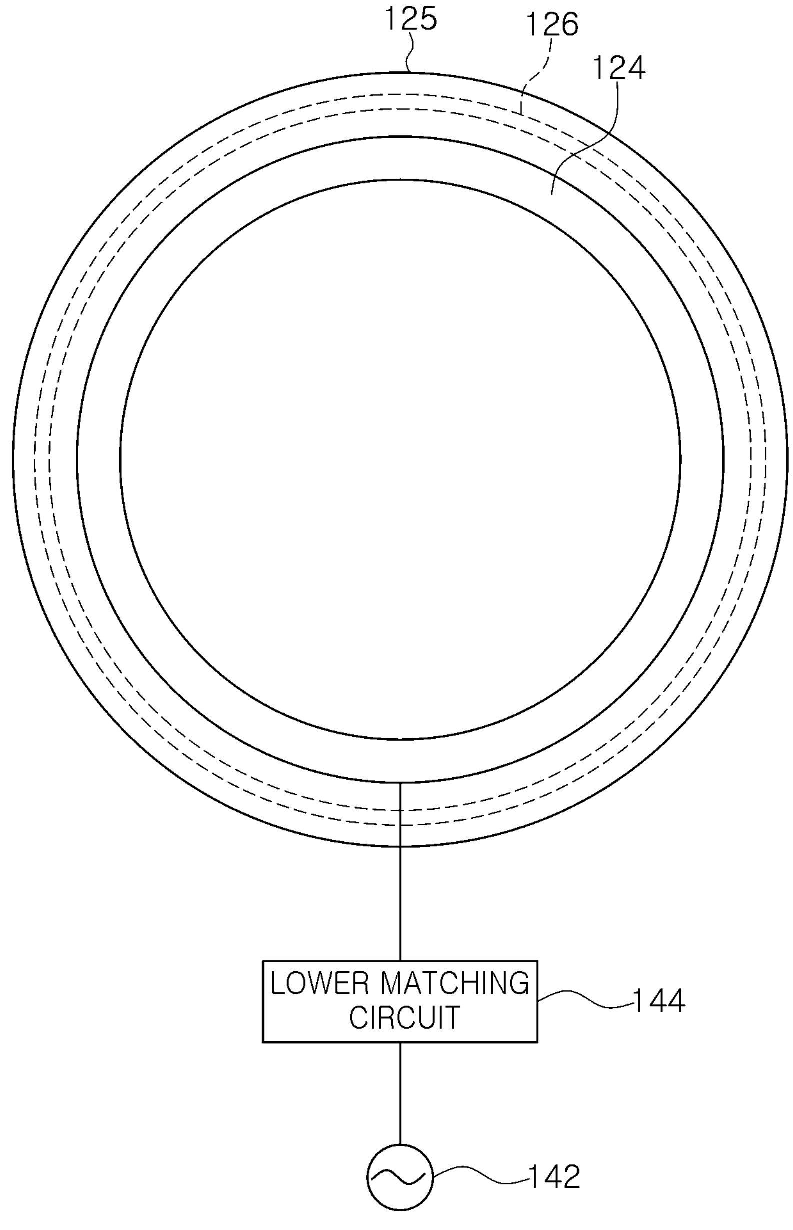
FIG. 9B is a plan view illustrating an example in which a lower detection member is embedded in a lower insulating member according to an example embodiment.

FIGS. 9A and 9B show examples in which an upper detection member and a lower detection member are disposed according to example embodiments.

FIG. 9A is a plan view illustrating an example in which the upper detection member 136 is embedded in the upper insulating member 135, and FIG. 9B is a plan view illustrating an example in which the lower detection member 126 is embedded in the lower insulating member 125. Referring to FIGS. 9A and 9B, the upper detection member 136 may be provided in a position surrounding the outer side of the upper electrode 134. The lower detection member 126 may be provided in a position surrounding the outer side of the lower electrode 124.

Referring to FIGS. 9A and 9B, the upper detection member 136 and the lower detection member 126 may each be provided as a detection member. The upper detection member 136 may detect an average value of RF parameters in an overall region of the upper electrode 134. The upper detection member 136 may detect average values of voltages and currents in the overall region of the upper electrode 134 and may represent the detected average value as graph data. The lower detection member 126 may detect an average value of the RF parameters in the overall region of the lower electrode 124. The lower detection member 126 may detect average values of voltages and currents in the overall region of the lower electrode 124 and may represent the detected average value as graph data.

Figure 10A:
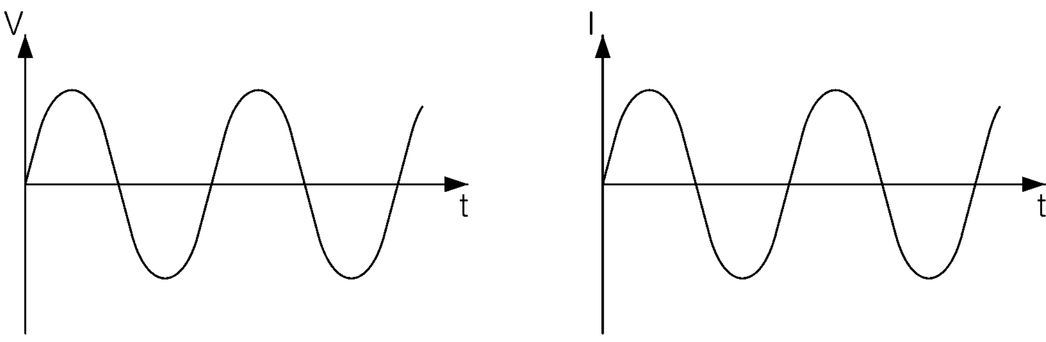
FIG. 10A is a graph illustrating a voltage and current measured by an upper detection member according to an embodiment of the present disclosure.
Figure 10B:
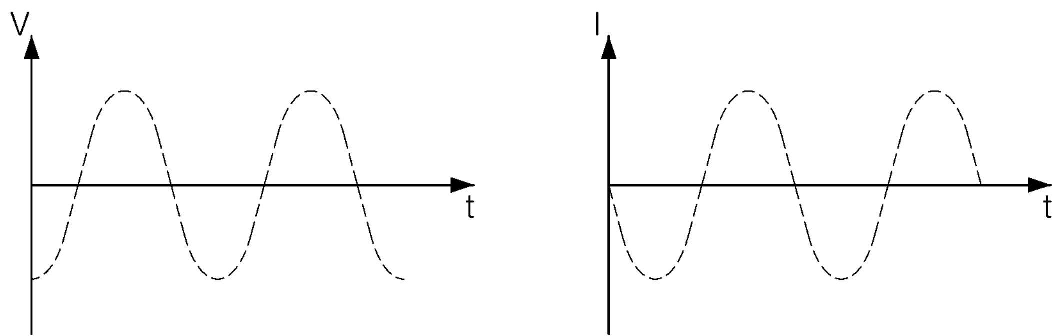
FIG. 10B is a graph illustrating a voltage and current measured by a lower detection member according to an embodiment of the present disclosure.

FIGS. 10A and 10B are graphs illustrating voltages and currents measured by an upper detection member and a lower detection member according to an embodiment of the present disclosure.

FIGS. 10A and 10B are graphs illustrating voltages and currents measured by the upper detection member 136 and the lower detection member 126 according to an embodiment of the present disclosure.

In FIGS. 10A and 10B, the upper voltage and upper current graphs measured by the upper detection member 136 are indicated by the solid lines, and the lower voltage and lower current graphs measured by the lower detection member 126 are indicated by the dotted lines. Using the detection member according to an embodiment of the present disclosure, it is possible to secure actual voltage and current graph data in a position adjacent to the detection member.

In the embodiment of FIGS. 10A and 10B, one upper detection member 136 and one lower detection member 126 may be provided, and one voltage and current graph may be acquired from the upper detection member 136 and one voltage and current graph may be acquired from the lower detection member 126.

According to another example, when a plurality of detection members are provided, voltage and current graphs corresponding to the number of the detection members may be acquired.

Figure 11A:
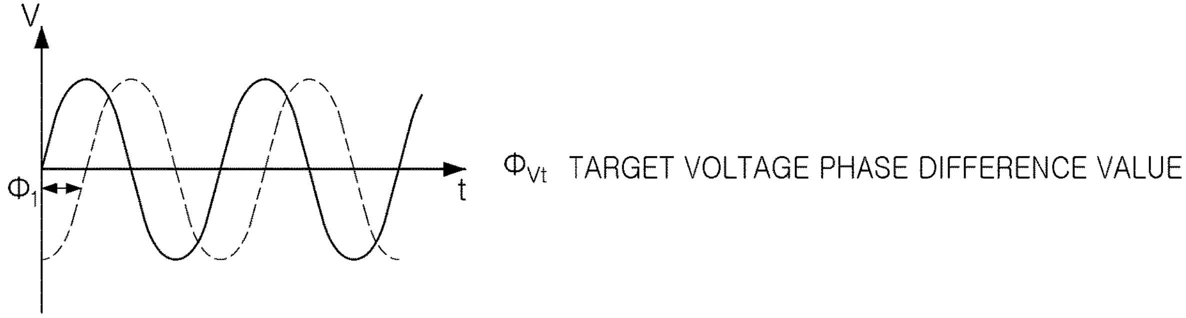
FIG. 11A is a diagram illustrating a comparison of a voltage phase difference after performing synchronization signal processing of an acquired voltage graph according to an embodiment of the present disclosure.
Figure 11B:
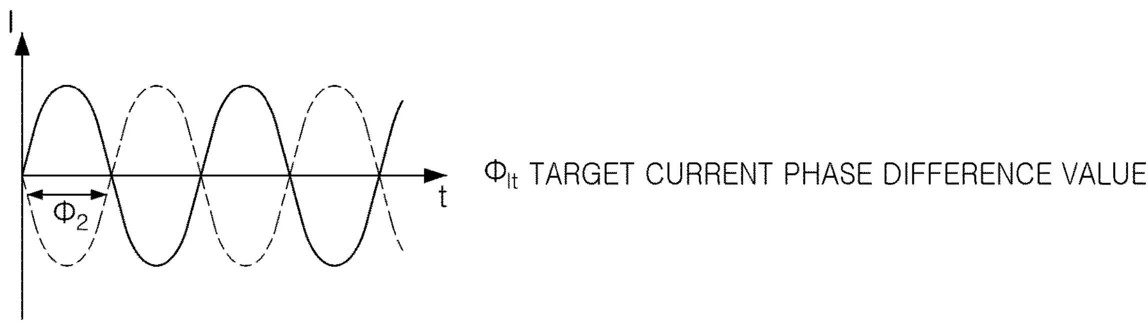
FIG. 11B is a diagram illustrating a comparison of a current phase difference after performing synchronization signal processing of an acquired current graph according to an embodiment of the present disclosure.

FIGS. 11A and 11B are diagrams illustrating a comparison of phase differences after performing synchronization signal processing of the acquired voltage and current graphs.

Referring to FIG. 11A, after performing synchronization signal processing to match a timing of a time axis, an upper voltage measured in the upper detection member 136 and a lower voltage measured in the lower detection member 126 may be compared to calculate a voltage phase difference. Referring to FIG. 11A, a voltage phase difference between the measured upper voltage and lower voltage is calculated as φ1.

Referring to FIG. 11B, after performing synchronization signal processing to match a timing of a time axis, the upper current measured by the upper detection member 136 and the lower current measured by the lower detection member 126 may be compared to calculate a current phase difference. Referring to FIG. 11B, the current phase difference between the measured upper current and lower current is calculated as φ2.

Referring to FIG. 11A, the actually measured and calculated voltage phase difference φ1 may be compared with a target voltage phase difference φVt, which is a target value.

Referring to FIG. 11B, the actually measured and calculated current phase difference φ2 may be compared with a target current phase difference φIt, which is a target value.

The target voltage phase difference φVt and the target current phase difference φIt may be differently provided for each plasma etching apparatus. The target voltage phase difference φVt and the target current phase difference φIt may vary depending on a process to be processed by the plasma etching apparatus. The target voltage phase difference φVt and the target current phase difference φIt may be values stored as optimized parameters in the data server 1000.

Figure 12A:
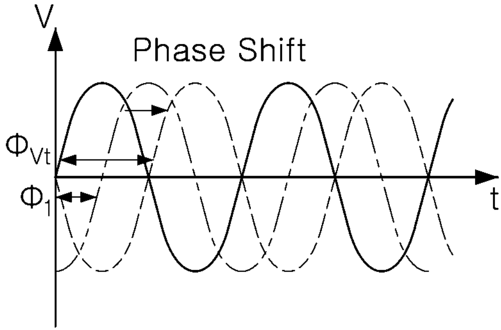
FIG. 12A is a diagram illustrating controlling a voltage phase difference to match a target voltage phase difference according to an embodiment of the present disclosure.
Figure 12B:
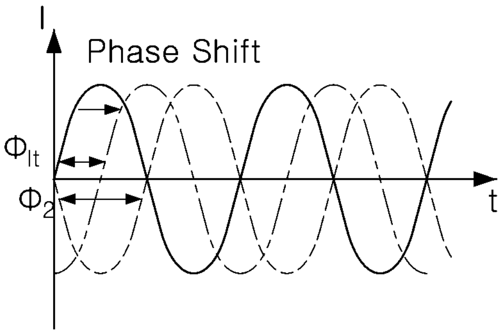
FIG. 12B is a diagram illustrating controlling a current phase difference to match a target current phase difference according to an embodiment of the present disclosure.

FIGS. 12A and 12B are diagrams illustrating controlling the calculated voltage phase difference or current phase difference to match the target voltage phase difference or target current phase difference, which is a target value.

FIG. 12A is a diagram illustrating controlling the voltage phase difference φ1 to match the target voltage phase difference φVt. FIG. 12B is a diagram illustrating controlling the current phase difference φ2 to match the target current phase difference φIt.

According to an example, the controller 170 may control a voltage phase of at least one of the RF power sources 141 and 142 so that the voltage phase difference φ1 matches the target voltage phase difference φVt or may control a current phase of at least one of the RF power sources 141 and 142 so that the current phase difference φ2 matches the target current phase difference φIt.

Referring to FIG. 12A, the controller 170 may shift a voltage phase of the lower RF power source 142 so that the calculated voltage phase difference φ1 matches the target voltage phase difference φVt. Referring to FIG. 12A, the phase difference between the voltage measured in the upper electrode 134 and the voltage measured in the lower electrode 124 may be adjusted to the target voltage phase difference φVt by controlling the phase of the voltage indicated by the dotted line.

Referring to FIG. 12B, the controller 170 may shift a current phase of the upper RF power source 141 so that the calculated current phase difference φ2 matches the target current phase difference φIt. Referring to FIG. 12B, the phase difference between the current measured in the upper electrode 134 and the current measured in the lower electrode 124 may be adjusted to the target current phase difference φIt by controlling the phase of the current indicated by the dotted line.

According to an example, when it is desired to control a phase of a voltage or current so that a measured phase difference matches a target phase difference, the lower RF power source 142 may be controlled based on data measured in the upper electrode 134 or the upper RF power source 141 may be controlled based on data measured in the lower electrode 124. According to an example, selection may be made based on voltage data and/or current data supplied to electrodes by an RF power source serving as a master.

The method of controlling a phase difference in FIGS. 9A to 12B may be a control method in a case in which one upper detection member 136 is embedded in the upper insulating member 135 and one lower detection member 126 is embedded in the lower insulating member 125. As such, when one upper detection member 136 and one lower detection member 126 are provided, a result of the RF parameter may be derived using an average value of all electrodes adjacent to the detection members. According to an example, when one upper detection member 136 and one lower detection member 126 are provided, one result value is obtained, and thus, a phase difference may be calculated by selecting any one of current data and voltage data and the result value may be derived.

Meanwhile, when the upper detection member 136 and the lower detection member 126 are provided in plural number, a RF parameter result of an electrode located at a distance adjacent to a position in which each detection member is disposed may be derived. In this case, results corresponding to the number of the upper detection member 136 and the lower the detection member 126 may be derived. According to an example, when a plurality of the upper detection member 136 and a plurality of the lower detection member 126 are provided, it is possible to separate phase difference control for each region through the phase shifter 180 connected to electrodes corresponding to the plurality of detection members.

Figure 13:
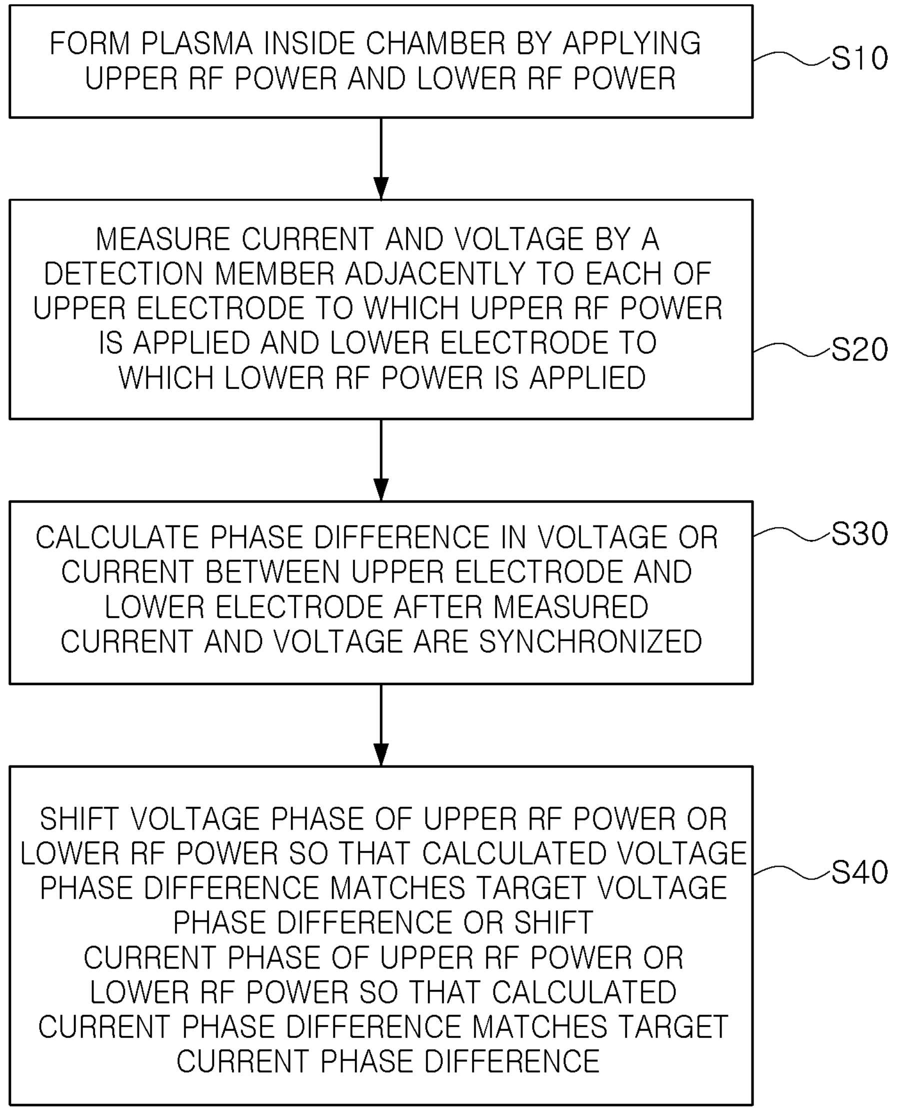
FIG. 13 is a flowchart illustrating a plasma processing method according to an embodiment of the present disclosure.

FIG. 13 is a flowchart illustrating a plasma processing method according to an embodiment of the present disclosure.

Plasma may be formed in the chamber by applying the upper RF power source 141 and the lower RF power source 142 (S10). In this case, the upper RF power source 141 and the lower RF power source 142 may be simultaneously applied.

When plasma is formed, the upper detection member 126 and the lower detection member 136 respectively adjacent to the upper electrode 134 to which the upper RF power source 141 is applied and the lower electrode 124 to which the lower RF power source 142 is applied may measure a current and voltage in the electrodes (S20). Here, when a plurality of the upper detection member 136 or a plurality of the lower detection member 126 are provided, current and voltage may be measured for each electrode adjacent to a position in which the plurality of detection members are disposed.

After synchronizing the current and voltage measured by the upper detection member 136 and the current and voltage measured by the lower detection member 126 on the time axis, a phase difference of a voltage or current between the upper electrode 134 and the lower electrode 124 may be calculated (S30). The voltage phase of the upper RF power source 141 or the lower RF power source 142 may be shifted so that the calculated voltage phase difference and the target voltage phase difference match, or the current phase of the upper RF power source 141 or the lower RF power source 142 may be shifted so that the calculated current phase difference and the target current phase difference match (S40). Accordingly, it is possible to control the closed loop phase shift of the RF power source in the plasma etching apparatus.

Figure 14:
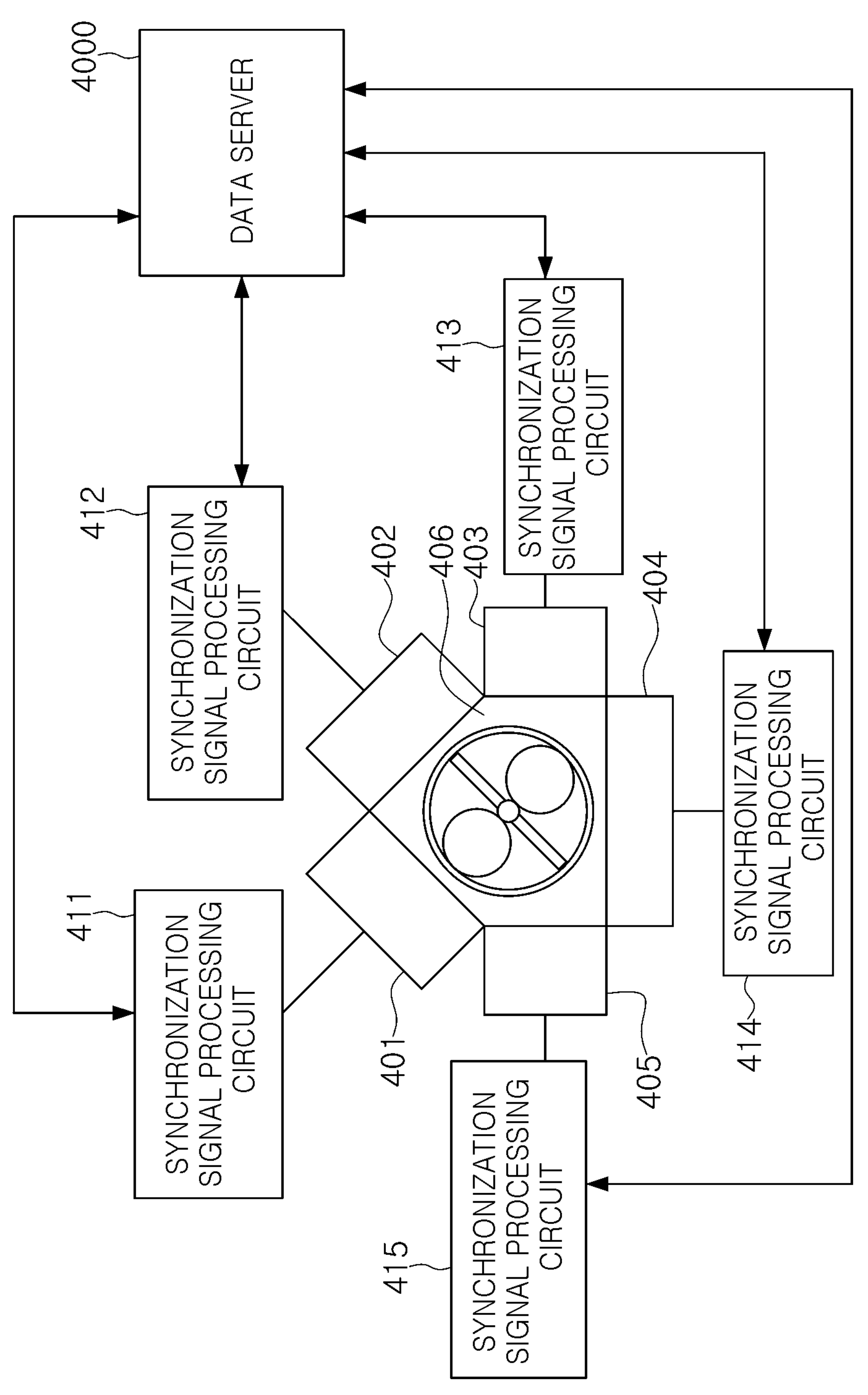
FIG. 14 is a diagram schematically illustrating a semiconductor processing system according to an embodiment of the present disclosure.

FIG. 14 is a diagram schematically illustrating a semiconductor processing system according to an embodiment of the present disclosure.

Referring to FIG. 14, a semiconductor processing system including a plasma etching apparatus according to an embodiment of the present disclosure may include a plurality of processing chambers 401 to 404 for performing a semiconductor process on a substrate W. For example, the plurality of processing chambers 401 to 404 may include a deposition processing chamber for performing a deposition process, a polishing processing chamber for performing a chemical mechanical polishing (CMP) process, and an etching process chamber for generating plasma including radicals and ions of a source gas or removing at least some of device layers included in the substrate W using an etching solution, etc. Meanwhile, the plurality of processing chambers may include an inspection processing chamber for inspecting the substrate W during the process or after the process is completed.

For example, the plurality of processing chambers 401 to 404 may receive the substrate W through a transfer chamber 405 and a load-lock chamber 406 to perform a semiconductor process. The transfer chamber 405 and the load-lock chamber 406 may include a transfer robot, and the transfer robot of the transfer chamber 405 and the load-lock chamber 406 may transfer the substrate W or the like to be processed. For example, the transfer robot of the transfer chamber 405 may remove a process target such as the substrate W from the load-lock chamber 406 and transfer the process target to the plurality of processing chambers 401 to 404 or transfer the process target between the plurality of processing chambers. In an embodiment, the transfer robot may be a handler. According to some embodiments, the processing target may not be limited to a wafer. For example, the substrate W may be various substrates other than a wafer, for example, a mother substrate for a display.

The transfer robot may include a chuck for fixing the process target and a linear stage for transferring the process target. For example, the chuck may be an electrostatic chuck (ESC) fixing the process target using electrostatic force. A plurality of protrusions in contact with the process target may be formed on the electrostatic chuck.

At least one processing chamber among the plurality of processing chambers 401 to 404 may be allocated as a chamber for performing an etching process. In an embodiment, the processing chamber may be a plasma processing chamber for removing a portion of a thin film formed on an upper surface of the substrate W using plasma. For example, equipment for plasma etching including the plasma processing chamber may be defined as a plasma etching apparatus.

The semiconductor processing chambers according to an example may each include a housing, an upper RF power source configured to supply upper RF power to an upper electrode in the housing, a lower RF power source configured to supply lower RF power to a lower electrode facing the upper electrode, an upper detection member configured to detect a parameter related to the upper RF power, and a lower detection member configured to detect a parameter related to the lower RF power.

The plurality of processing chambers 401 to 404 may be connected to synchronization signal processing circuits 411 to 415, and the synchronization signal processing circuits 411 to 415 may be connected to one data server 4000. In the embodiment illustrated in FIG. 14, the synchronization signal processing circuits 411 to 415 are illustrated as being connected to the processing chambers 401 to 404, respectively, but in some embodiments, a plurality of semiconductor processing chambers 401 to 404 may be connected to a same one of the synchronization signal processing circuits 411 to 415.

According to an example, the data server 4000 may receive raw data from each of the synchronization signal processing circuits 411 to 415 connected to the plurality of processing chambers 401 to 404 and store the raw data. According to an example, the data server 4000 may optimize the respective operating parameters included in the semiconductor processing chambers 401 to 404 based thereon. According to an example, the operating parameter may be a voltage or current parameter of the RF power source. According to an example, the operating parameter may be a phase difference between the upper electrode and the lower electrode included in the processing chamber.

For example, if there are plasma etching chambers performing the same semiconductor process under the same conditions, among the (semiconductor) processing chambers 401 to 404, the data server 4000 may commonly adjust parameters of the RF power source connected to the chambers performing the same process. Also, the data server 4000 may commonly adjust parameters of all the chambers performing the same process based on raw data received from at least one of the chambers performing the same process, and in this case, data throughput of the data server 4000 may be reduced.

According to embodiments, the data server 4000 may comprise at least one processor and memory storing computer instructions. The computers instructions, when executed by the at least one processor, may be configured to cause the data server 4000 to perform its functions.

In the plasma etching apparatus according to an embodiment of the present disclosure, it may be possible to accurately measure RF parameters inside a chamber.

The plasma etching apparatus according to an embodiment of the present disclosure has an effect of enabling control of plasma uniformity with improved accuracy by providing a detection member with improved spatial resolution.

At least one of the components, elements, modules or units (collectively "components" in this paragraph) represented by a block in the drawings such as FIGS. 1, 7, 8 and 14 may be embodied as various numbers of hardware, software and/or firmware structures that execute respective functions described above, according to an example embodiment. These components may include the upper detection member 136, the lower detection member 126, the upper matching circuit 143, the lower matching circuit 144, the synchronization signal processing circuit 160, the controller 170, and the phase shifter 280 not being limited thereto. According to example embodiments, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like.

The various and beneficial advantages and effects of embodiments of the present disclosure are not limited to the above, and other advantaged and effects may be understood in the course of describing specific embodiments of the present disclosure.

While non-limiting example embodiments have been illustrated and described above, it will be apparent to those skilled in the art that modifications and variations could be made without departing from the scope of the present disclosure.

What is claimed is:

1. A plasma etching apparatus comprising:

a housing having a processing space;

a support inside the housing, the support configured to support a substrate and comprising at least one lower electrode;

at least one upper electrode facing the at least one lower electrode;

a sidewall electrode disposed on a sidewall of the housing;

a lower radiofrequency (RF) power source connected to the at least one lower electrode and configured to apply RF power;

an upper RF power source connected to the at least one upper electrode and configured to apply RF power;

a lower insulator adjacent to the at least one lower electrode, the lower insulator comprising a ring shape that surrounds the at least one lower electrode in horizontal directions;

an upper insulator adjacent to the at least one upper electrode, the upper insulator comprising a ring shape that surrounds the at least one upper electrode in the horizontal directions;

at least one lower detector embedded in the ring shape of the lower insulator; and at least one upper detector embedded in the ring shape of the upper insulator.

2. The plasma etching apparatus of claim 1, wherein the at least one lower detector is configured to detect an average value of a voltage or a current of the at least one lower electrode, and the at least one upper detector is configured to detect an average value of a voltage or a current of the at least one upper electrode.

3. The plasma etching apparatus of claim 1, wherein the at least one lower detector comprises a plurality of lower detectors, the at least one upper detector comprises a plurality of upper detectors, the plurality of lower detectors are spaced apart from each other at a same first interval in a first direction within the ring shape of the lower insulator, and the plurality of upper detectors are spaced apart from each other at a same second interval in the first direction within the ring shape of the upper insulator.

4. The plasma etching apparatus of claim 3, wherein the first interval and the second interval are different from each other.

5. The plasma etching apparatus of claim 3, wherein a total number of the plurality of lower detectors and a total number of the plurality of upper detectors are equal to each other.

6. The plasma etching apparatus of claim 3, wherein a total number of the plurality of lower detectors and a total number of the plurality of upper detectors are different from each other.

7. The plasma etching apparatus of claim 3, wherein the plurality of lower detectors are positioned on a same first plane within the lower insulator, and the plurality of upper detectors are positioned on a same second plane within the upper insulator.

8. The plasma etching apparatus of claim 3, wherein the at least one lower detector comprises n lower detectors, and the at least one upper detector comprises m upper detectors, n and m are natural number of 2 or greater, the at least one lower electrode comprises n number of lower electrodes, and the at least one upper electrode comprises m number of upper electrodes.

9. The plasma etching apparatus of claim 8, further comprising:

m first phase shifters connected between the m upper electrodes and the upper RF power source; and n second phase shifters connected between the n lower electrodes and the lower RF power source.

10. The plasma etching apparatus of claim 1, further comprising:

a synchronization signal processing circuit connected to the at least one lower detector and the at least one upper detector, and configured to perform synchronization on a lower voltage and a lower current measured by the at least one lower detector, and an upper voltage and an upper current measured by the at least one upper detector.

11. The plasma etching apparatus of claim 10, further comprising:

a controller configured to control at least one from among the upper RF power source and the lower RF power source so that a phase difference between the lower voltage and the upper voltage synchronized by the synchronization signal processing circuit matches a target voltage phase difference or a phase difference between the lower current and the upper current synchronized by the synchronization signal processing circuit matches a target current phase difference.

12. The plasma etching apparatus of claim 11, wherein the controller is further configured to shift-control a phase of a voltage or a current output by at least one from among the upper RF power source and the lower RF power source.

13. The plasma etching apparatus of claim 1, wherein the lower RF power source and the upper RF power source are configured to apply power of a same frequency.

14. A plasma etching apparatus comprising:

a housing having a processing space;

an electrostatic chuck inside the housing, the electrostatic chuck configured to support a substrate and comprising at least one lower electrode;

at least one upper electrode facing the at least one lower electrode;

a lower radiofrequency (RF) power source connected to the at least one lower electrode and configured to apply lower RF power of a first frequency;

an upper RF power source connected to the at least one upper electrode and configured to supply upper RF power of the first frequency;

a lower insulator disposed adjacently to the at least one lower electrode comprising a ring shape that surrounds the at least one lower electrode in horizontal directions, the ring shape of the lower insulator embedded with at least one lower detector;

an upper insulator disposed adjacent to the at least one upper electrode and comprising a ring shape that surrounds the at least one upper electrode in the horizontal directions, the ring shape of the upper insulator embedded with at least one upper detector; and a controller configured to perform closed loop phase shift control on at least one from among the upper RF power source and the lower RF power source by performing a calculation that includes a lower parameter measurement value obtained by the at least one lower detector and an upper parameter measurement value obtained by the at least one upper detector, wherein a total number of the at least one lower electrode is equal to a total number of the at least one lower detector, and a total number of the at least one upper electrode is equal to a total number of the at least one upper detector.

15. The plasma etching apparatus of claim 14, wherein the total number of the at least one lower detector and the total number of the at least one upper detector are each equal to or greater than 4 and equal to or less than 8.

16. The plasma etching apparatus of claim 14, further comprising:

at least one phase shifter connected to the lower RF power source and configured to shift a phase of a voltage or a current output by the lower RF power source, wherein a total number of the at least one phase shifter is equal to the total number of the at least one lower electrode, and the at least one phase shifter is connected to the at least one lower electrode, respectively.

17. The plasma etching apparatus of claim 14, further comprising:

at least one phase shifter connected to the upper RF power source and configured to shift a phase of a voltage or a current output by the upper RF power source, wherein a total number of the at least one phase shifter is equal to the total number of the at least one upper electrode, and the at least one phase shifter is connected to the at least one upper electrode, respectively.

18. The plasma etching apparatus of claim 14, wherein the lower parameter measurement value is an average value of a current or voltage detected from the at least one lower electrode, and the upper parameter measurement value is an average value of a current or voltage detected from the at least one upper electrode, and the calculation includes at least one from among a calculation of a phase difference between the average value of the current detected from the at least one upper electrode and the average value of the current detected from the at least one lower electrode and a calculation of a phase difference between the average value of the voltage detected from the at least one upper electrode and the average value of the voltage detected from the at least one lower electrode.

19. The plasma etching apparatus of claim 1, wherein the at least one upper electrode is separated from the sidewall electrode by the upper insulator.

20. The plasma etching apparatus of claim 1, wherein the lower insulator is on an upper surface of the support, and wherein the plasma etching apparatus further comprises a focus ring that is on an upper surface of the lower insulator.

* * * * *